(12) United States Patent
Russell et al.

(10) Patent No.: US 6,204,160 B1
(45) Date of Patent: Mar. 20, 2001

(54) METHOD FOR MAKING ELECTRICAL CONTACTS AND JUNCTIONS IN SILICON CARBIDE

(75) Inventors: Stephen D. Russell, San Diego; Ayax D. Ramirez, Chula Vista, both of CA (US)

(73) Assignee: The United States of America as represented by the Secretary of the Navy, Washington, DC (US)

(*) Notice: Subject to any disclaimer, the term of this patent is extended or adjusted under 35 U.S.C. 154(b) by 0 days.

(21) Appl. No.: 09/255,373

(22) Filed: Feb. 22, 1999

(51) Int. Cl.[7] ............................................. H01L 21/3205
(52) U.S. Cl. .................. 438/602; 438/520; 438/931; 438/522
(58) Field of Search .................. 438/602, 535, 438/530, 565, 522, 520, 931

(56) References Cited

U.S. PATENT DOCUMENTS

| | | |
|---|---|---|
| 2,918,396 | 12/1959 | Hall . |
| 2,937,323 | 5/1960 | Kroko et al. . |
| 2,937,324 | 5/1960 | Kroko et al. . |
| 3,009,834 | 11/1961 | Hanlet . |
| 3,063,876 | 11/1962 | Le May et al. . |
| 3,082,126 | 3/1963 | Chang . |
| 3,308,356 | 3/1967 | Rutz . |
| 3,458,779 | 7/1969 | Blank . |
| 3,504,181 | 3/1970 | Chang et al. . |
| 3,663,722 | 5/1972 | Kamath . |
| 3,773,553 | 11/1973 | Kamath . |
| 5,225,371 | * 7/1993 | Sexton et al. . |
| 5,409,859 | 4/1995 | Glass et al. . |
| 5,425,860 | * 6/1995 | Truher et al. ................ 204/192.23 |
| 5,604,135 | 2/1997 | Edmond et al. . |
| 5,858,473 | * 1/1999 | Yamazaki et al. ................ 427/554 |

* cited by examiner

*Primary Examiner*—Caridad Everhart
(74) *Attorney, Agent, or Firm*—Harvey FEndelman; Eric James Whitesell; James A. Ward

(57) ABSTRACT

A method for making electrical contacts and junctions in silicon carbide that concurrently incorporates and activates dopants from a gaseous ambient. The low temperature processing of the present invention prevents the formation of crystalline defects during annealing and preserves the quantitative chemical properties of the silicon carbide. Improved activation of dopants incorporated in a silicon carbide sample is provided for making the electrical contacts and junctions.

26 Claims, 3 Drawing Sheets

METHOD FOR MAKING ELECTRICAL CONTACTS AND JUNCTIONS IN SILICON CARBIDE

Licensing Information

The invention described below is assigned to the United States Government and is available for licensing commercially. Technical and licensing inquiries may be directed to Harvey Fendelman, Patent Counsel, SPAWAR Systems Center San Diego, Code D0012 Rm 103, 53510 Silvergate Avenue, San Diego, Calif. 92152; telephone no. (619)553-3001; fax no. (619)553-3821.

BACKGROUND OF THE INVENTION

The present invention relates to forming electrical contacts and junctions in silicon carbide. More specifically, but without limitation thereto, the present invention relates to incorporating dopants in silicon carbide from a gaseous ambient and concurrently activating the dopants by photo illumination.

The semiconductor silicon carbide (SiC) enjoys wide interest due to its applicability in high temperature, high power and photonic devices and circuits. However, greater difficulties in fabrication relative to silicon have prevented the full realization of its capabilities in these applications. The high melting point and limited diffusion of impurities in silicon carbide have greatly limited the use of ion implantation and furnace annealing commonly employed in the silicon microelectronics industry as a means of incorporating and activating dopants. These fabrication techniques are desirable for producing self-aligned field-effect transistor structures for use in discrete power devices and digital logic circuits. Ion implantation of n-type dopants, such as arsenic, in SiC has met with limited success; however, it requires annealing temperatures in excess of 1300° C. for activation, and ion implantation and annealing of p-type dopants has demonstrated only about 5% activation, insufficient for practical device fabrication. Alternative techniques are therefore desired to obtain a greater degree of dopant activation in SiC, particularly with p-type dopants.

SUMMARY OF THE INVENTION

The present invention is directed to overcoming the problems described above, and may provide further related advantages. No embodiment of the present invention described herein shall preclude other embodiments or advantages that may exist or become obvious to those skilled in the art.

A method for making electrical contacts and junctions in silicon carbide of the present invention concurrently incorporates and activates dopants from a gaseous ambient. The low temperature processing of the present invention prevents the formation of crystalline defects during annealing and preserves the quantitative chemical properties of the silicon carbide. Improved activation of dopants incorporated in a silicon carbide sample is provided for making the electrical contacts and junctions.

An advantage of the method for making electrical contacts and junctions in silicon carbide of the present invention is that the formation of step bunching and other crystalline defects may be avoided.

Another advantage is that the stoichiometry of the SiC may be preserved.

Still another advantage is that volatile reaction of molten SiC with the atmosphere may be avoided.

Yet another advantage is that the method of the present invention concurrently incorporates and electrically activates dopant impurities at a low temperature relative to current methods.

The features and advantages summarized above in addition to other aspects of the present invention will become more apparent from the description, presented in conjunction with the following drawings.

DESCRIPTION OF THE INVENTION

The following description is presented solely for the purpose of disclosing how the present invention may be made and used. The scope of the invention is defined by the claims.

Figure 1:
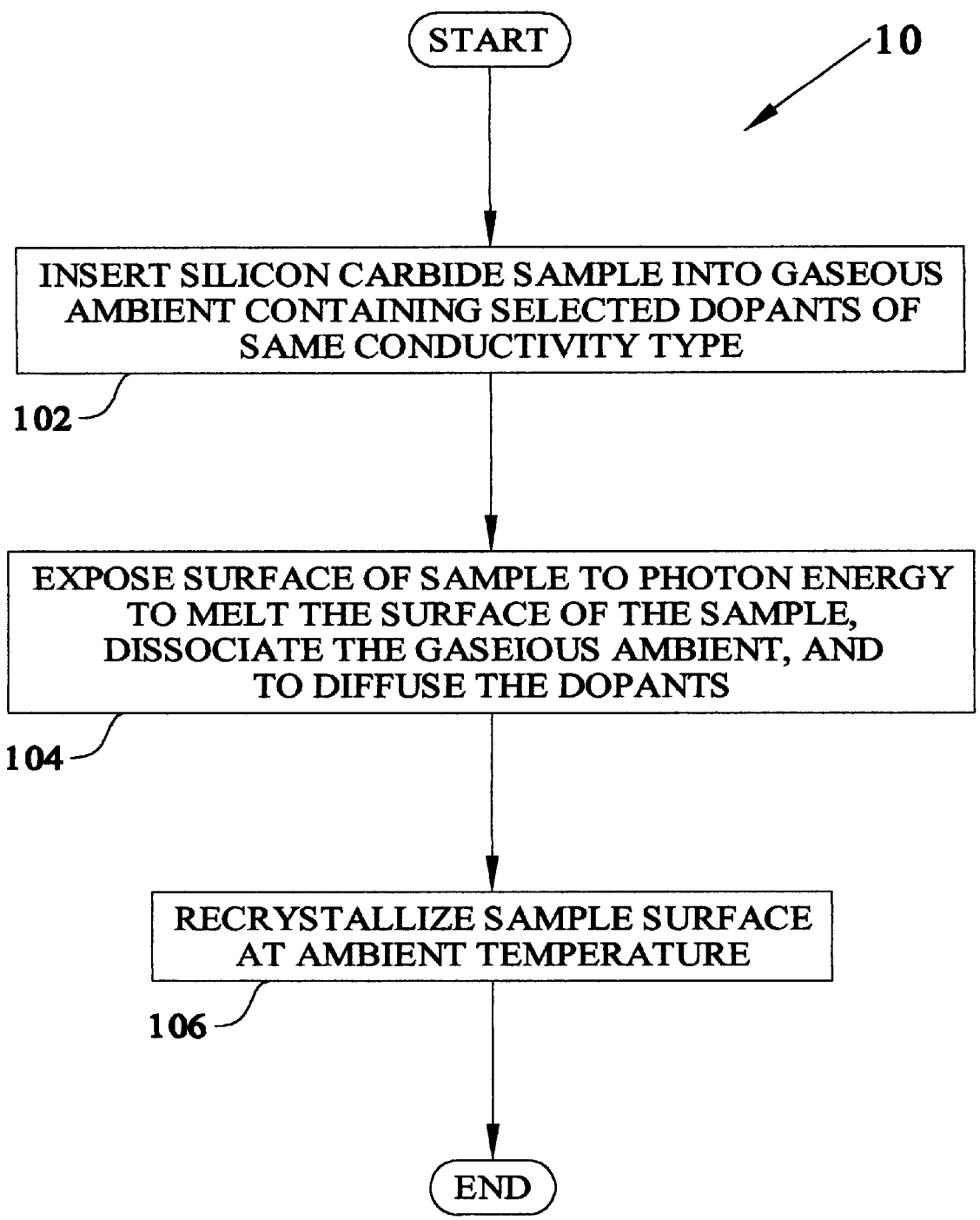
FIG. 1 is a flow chart of a process of the present invention for making electrical contacts in silicon carbide.

FIG. 1 is a flow chart of an electrical contact process 10 for making electrical contact to silicon carbide (SiC). At step 102 a silicon carbide sample is inserted into a gaseous ambient containing selected dopants. The silicon carbide sample may be, for example, a bulk silicon carbide wafer or wafer fragment, or a layer or region of SiC formed on a substrate made of a different material, such as silicon or sapphire. The silicon carbide sample may also be a silicon carbide structure incorporated into an electronic or photonic device, or into a microelectromechanical system (MEMS). The silicon carbide sample typically has a conductivity of a given type, either n-type or p-type depending on whether it contains acceptor or donor impurities, or dopants. The dopants in the gaseous ambient are selected to match the predominant impurity type in the silicon carbide sample. The gaseous ambient may be any gas that contains acceptor or donor impurities appropriate to silicon carbide such as boron, phosphorous, nitrogen, arsenic, aluminum, and the like. The gas may be, for example, boron trifluoride, arsenic pentafluoride, and the like.

At step 104 the surface of the silicon carbide sample is exposed to photon energy sufficient to melt the surface of the silicon carbide sample, dissociate the gaseous ambient and diffuse the dopants into the molten SiC.

At step 106, the molten silicon carbide surface is recrystallized at the ambient temperature.

Figure 2:
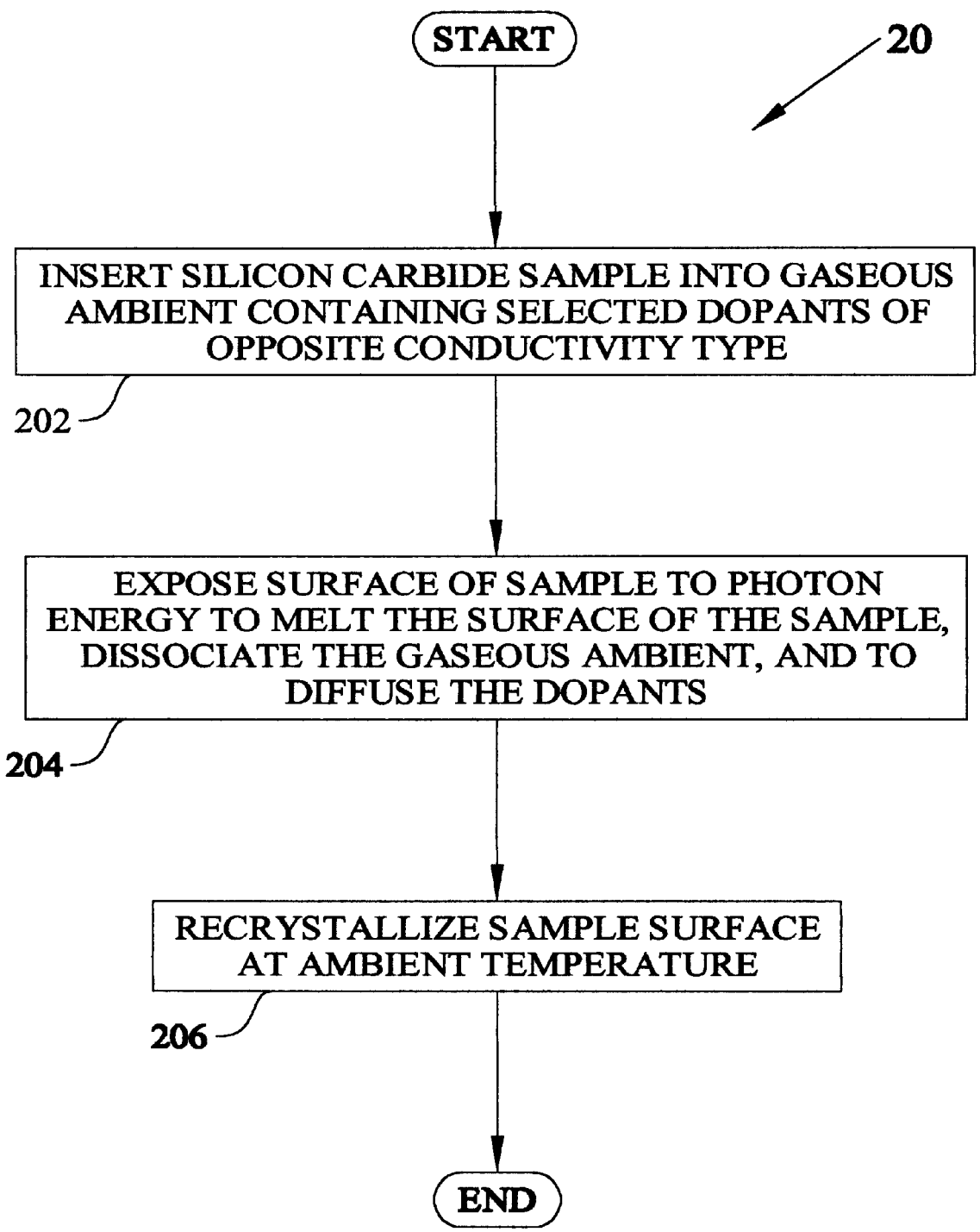
FIG. 2 is a flow chart of a process of the present invention for making electrical junctions in silicon carbide.
Figures 3A, 3B, 3C, 3D:
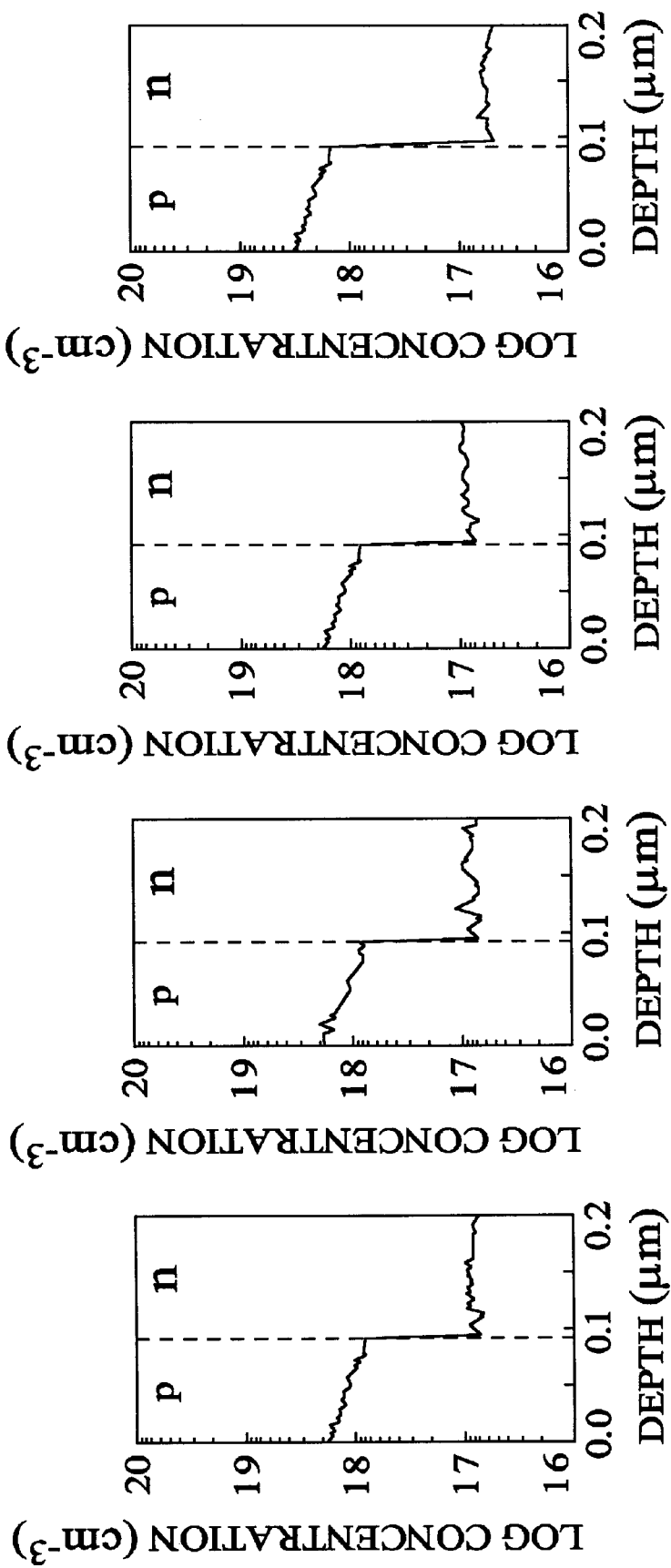
FIGS. 3A–3D are plots of activated carrier concentration versus depth for different numbers of laser energy pulses observed from the method of the present invention.

FIG. 2 is a flow chart of an electrical junction process 20 for making an electrical junction in silicon carbide. Steps 202, 204 and 206 are similar to steps 102, 104 and 106 of the electrical contact process in FIG. 1, except that the dopants in the gaseous ambient are selected to have the opposite conductivity type to that of the silicon carbide sample.

Examples of a suitable silicon carbide sample are single crystal 4H-SiC and 6H-SiC wafers oriented 3.5° off-axis from the (0001) plane uniformly doped with nitrogen or aluminum. In addition to these examples, other silicon carbide polytypes may also be processed using the method of the present invention. The silicon carbide sample is preferably placed in a processing chamber evacuated to less than $10^{-7}$ Torr and back-filled with a processing atmosphere that also serves to avoid reaction of the molten surface of the silicon carbide sample with air. An exemplary source of photon energy is a Questek model 2860 KrF excimer laser operating at a wavelength of 248 nm. Pulse repetition rates of from about 1 to 2 Hz may be used with pulse energies up to about 700 mJ. Other wavelengths and pulse energies may be selected as appropriate. The laser intensity profile may be homogenized, such as explained in U.S. Pat. No. 4,932,747 titled "FIBER BUNDLE HOMOGENIZER AND METHOD UTILIZING SAME" by S. D. Russell, et al., incorporated herein by reference thereto. The laser intensity profile is shaped and directed normal to the surface of the silicon carbide sample.

The melt duration of the surface of the silicon carbide sample may be measured by a reflectivity monitor to observe increased reflectivity of emissions from an AlGaAs laser diode operating at a wavelength of 790 nm reflected from the region of the silicon carbide sample illuminated by the excimer laser. An example of such a measurement is described in U.S. Pat. No. 5,385,633 titled "METHOD FOR LASER ASSISTED SILICON ETCHING USING HALO-CARBON AMBIENTS" by S. D. Russell, et al., incorporated herein by reference thereto. The laser fluence may be controlled by varying the energy of the pulses, by dielectric-coated beam splitting attenuators and the like.

A typical melt threshold for 4H-SiC and 6H-SiC samples is about 0.8 J/cm$^2$, and melt duration typically increases linearly from about 25 ns to 55 ns as the fluence is increased from about 0.9 J/cm$^2$ to 1.8 J/cm$^2$.

A Rigaku D/MAX-RBX diffractometer has been used to make θ–2θ and rocking curve (ω scans) of each laser illuminated sample and an unprocessed reference. The Kα x-ray lines of a Cu target were diffracted by the silicon carbide sample and directed to a scintillation counter detector by a diffracted beam monochrometer. A molybdenum mask having a thickness of about 0.25 mm and an aperture of about 2.1 mm with beveled edges to minimize shadowing was used to ensure that the x-ray beam was diffracted only from the area of interest. Using this arrangement, the two principal SiC peaks at 2θ values of about 35.5° and 75.3° were readily detected, corresponding to diffractions from the (004) and (008) crystal planes. Changes were not observed in silicon carbide samples recrystallized by laser, unlike silicon carbide samples furnace annealed after ion implanting of dopants. No significant broadening were observed in the half-width of the rocking curves (ω scans) of the (004) and (008) peaks produced by the measurement of the disruption of the SiC (001) crystal planes between the melt thresholds of about 0.8 J/cm$^2$ and 1.4 J/cm$^2$, which is indicative of resolidification without the introduction of new defects into the silicon carbide sample.

The x-ray results have been confirmed by Rutherford Backscattering Spectrometry (RBS) ion channeling studies using 2.275 MeV $^4$He$^{+2}$ ion beam ($I_b$=50 μCoulombs) to quantify the degree of crystal damage. Channeled and rotating random RBS spectra were acquired by an angle detector angle at 160° and a glancing angle detector at 105° from the forward trajectory of the incident He ion beam for each silicon carbide sample. The glancing angle detector at 105° is sensitive to surface layers and was used to obtain precise damage depths. The percentage of crystalline damage from the RBS spectra was obtained by comparing the de-channeled yield with that of the random spectra and accounting for surface scattering. The results were consistent with the x-ray analysis. Laser fluences above about 1.4 J/cm$^2$ exhibited substantial damage (nearly 40%) while fluences greater than about 2.0 J/cm$^2$ completely amorphized the surface layer of the silicon carbide sample. A critical processing fluence range of from about 0.8 J/cm$^2$ to about 1.4 J/cm$^2$ appears to cause little or no damage to the surface of the silicon carbide sample.

In an example of the process of the present invention, 6HSiC samples were placed in a processing chamber which was evacuated to less than 10$^{-7}$ Torr and back-filled with 10 psi $^{11}$B-enriched boron trifluoride atmosphere. The samples were illuminated at 1.3 J/cm$^2$ with 1, 10, 20 and 50 pulses in the doping ambient. Point-contact current-voltage measurements (PCIV) were performed in the laser illuminated region. PCIV, a technique analogous to spreading resistance profilometry, is used to determine the concentration of electrically activated carriers in compound semiconductors using a two-point current voltage probe along a polished bevel. FIG. 3A–3D show the electrically active carrier concentration versus depth obtained from the PCIV voltage profiling for 1, 10, 20 and 50 pulses respectively. Boron activation is observed with a maximum carrier concentration of 3.4×10$^{18}$ cm$^{-3}$ with a junction depth of ~90 nm. Variations in carrier concentration and junction depth may be achieved by appropriate selection of the processing parameters described above. The abruptness of the junction edge is characteristic of a laser formed junction where enhanced diffusion occurs during the annealing phase. Little change in carrier concentration is observed with increasing pulses, demonstrating that a single pulse can concurrently incorporate and activate dopants in silicon carbide.

Additional process controls include mass flow controllers for process and purge gases, evacuation systems and alignment systems.

Additional processing steps may be added, for example, forming additional contact layers to interconnect regions of high carrier concentration to other portions of the semiconductor device or circuit. The step of exposing the sample to photon energy may be unpatterned, or it may include patterning (masking). The photon energy may be pulsed or continuous wave. Excimer lasers having wavelengths in the range from about 193 nm and 351 nm may also be used as sources of photon energy. Other sources of photon energy may also be used as made known in the art.

Other modifications, variations, and applications of the present invention may be made in accordance with the above teachings other than as specifically described to practice the invention within the scope of the following claims.

We claim:

1. A method for making electical contacts in silicon carbinde comprising the following steps:
    disposing a surface of a silicon carbide sample having a first conductivity type into a gaseous ambient containing dopants having the first conductivity type;
    exposing the sample surface to photon energy to melt the sample surface, to dissociate the gaseous ambient, and to diffuse the dopants into the sample; and
    recrystallizing the sample surface at a selected temperature thereby activating the dopants diffused into the sample.

2. The method for making electrical contacts in silicon carbide of claim 1 wherein the sample is one of a bulk silicon carbide wafer, a bulk silicon carbide wafer fragment, a layer of silicon carbide formed on a substrate, a silicon carbide electronic device, a silicon carbide photonic device, and a silicon carbide microelectromechanical system.

3. The method for making electrical contacts in silicon carbide of claim 1 wherein the photon energy has a range of from about 0.8 J/cm$^2$ to about 1.4 J/cm$^2$.

4. The method for making electrical contacts in silicon carbide of claim 1 wherein the photon energy is generated by a laser beam.

5. The method for making electrical contacts in silicon carbide of claim 4 wherein the laser beam has a wavelength between about 193 and about 351 nm.

6. The method for making electrical contacts in silicon carbide of claim 4 wherein the laser beam has a pulse repetition rate between about 1 and about 2 Hz.

7. The method for making electrical contacts in silicon carbide of claim 6 wherein the laser beam has a pulse energy of up to about 700 mJ.

8. The method for making electrical contacts in silicon carbide of claim 4 wherein the laser beam has a homogenized intensity profile.

9. The method for making electrical contacts in silicon carbide of claim 1 wherein the gaseous ambient is one of boron trifluoride and arsenic pentafluoride.

10. The method for making electrical contacts in silicon carbide of claim 1 wherein the selected dopants include at least one of boron, phosphorous, nitrogen, arsenic, and aluminum.

11. The method for making electrical contacts in silicon carbide of claim 1 further including the steps of forming layers on the surface of the sample and making additional electrical contacts in the layers to interconnect regions of high carrier concentration.

12. The method for making electrical contacts in silicon carbide of claim 1 wherein the photon energy has a range of from about 0.8 J/cm$^2$ to about 1.4 J/cm$^2$.

13. The method for making electrical contacts in silicon carbide of claim 1 wherein the photon energy is generated by a pulsed laser.

14. The method for making electrical contacts in silicon carbide of claim 1 wherein the selected temperature for recrystallizing the surface of the sample is ambient room temperature.

15. A method for making electrical junctions in silicon carbide comprising the following steps:
   disposing a surface of a silicon carbide sample having a first conductivity type into a gaseous ambient containing dopants having a second conductivity type that is opposite to the first conductivity type;
   exposing the sample surface to photon energy to melt the sample surface, to dissociate the gaseous ambient, and to diffuse the dopants into the sample; and
   recrystallizing the sample surface at a selected temperature thereby activating the dopants diffused into the sample.

16. The method for making electrical junctions in silicon carbide of claim 15 wherein the sample is one of a bulk silicon carbide wafer, a bulk silicon carbide wafer fragment, a layer of silicon carbide formed on a substrate, a silicon carbide electronic device, a silicon carbide photonic device and a silicon carbide microelectromechanical system.

17. The method for making electrical junctions in silicon carbide of claim 15 wherein the photon energy has a range of from about 0.8 J/cm$^2$ to about 1.4 J/cm$^2$.

18. The method for making electrical junctions in silicon carbide of claim 15 wherein the photon energy is generated by a laser beam.

19. The method for making electrical junctions in silicon carbide of claim 18 wherein the laser beam has a wavelength between about 193 and about 351 nm.

20. The method for making electrical junctions in silicon carbide of claim 18 wherein the laser beam has a pulse repetition rate of from about 1 to 2 Hz.

21. The method for making electrical junctions in silicon carbide of claim 20 wherein the laser beam has a pulse energy of up to about 700 mJ.

22. The method for making electrical junctions in silicon carbide of claim 18 wherein the laser beam has a homogenized intensity profile.

23. The method for making electrical junctions in silicon carbide of claim 15 wherein the gaseous ambient is one of boron trifluoride and arsenic pentafluoride.

24. The method for making electrical junctions in silicon carbide of claim 15 wherein the selected dopants include at least one of boron, phosphorous, nitrogen, arsenic, and aluminum.

25. The method for making electrical junctions in silicon carbide of claim 15 further including the steps of forming layers on the surface of the sample and making additional electrical contacts in the layers to interconnect regions of high carrier concentration.

26. The method for making electrical junctions in silicon carbide of claim 15 wherein the selected temperature for recrystallizing the surface of the sample is ambient room temperature.

* * * * *